United States Patent
Steinhoff

(10) Patent No.: US 8,110,462 B2
(45) Date of Patent: Feb. 7, 2012

(54) REDUCED FINGER END MOSFET BREAKDOWN VOLTAGE (BV) FOR ELECTROSTATIC DISCHARGE (ESD) PROTECTION

(75) Inventor: Robert Michael Steinhoff, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 114 days.

(21) Appl. No.: 11/356,256

(22) Filed: Feb. 16, 2006

(65) Prior Publication Data

US 2006/0138547 A1 Jun. 29, 2006

Related U.S. Application Data

(62) Division of application No. 10/852,967, filed on May 25, 2004, now Pat. No. 7,034,364.

(51) Int. Cl.
*H01L 21/8238* (2006.01)
(52) U.S. Cl. ........ 438/215; 438/231; 438/232; 438/234; 438/281; 438/284; 438/286; 438/305; 438/307; 438/401; 438/527; 257/342; 257/343; 257/346; 257/355; 257/357; 257/E29.026; 257/E29.027
(58) Field of Classification Search .................. 438/215, 438/281, 401, 284, 286, 307, 527
See application file for complete search history.

(56) References Cited

U.S. PATENT DOCUMENTS

| | | | |
|---|---|---|---|
| 4,343,015 A * | 8/1982 | Baliga et al. | 257/267 |
| 4,753,896 A | 6/1988 | Matloubian | |
| 4,825,280 A | 4/1989 | Chen et al. | |
| 5,060,037 A | 10/1991 | Rountree | |
| 5,342,798 A * | 8/1994 | Huang | 438/286 |
| 5,493,133 A | 2/1996 | Duvvury et al. | |
| 5,500,546 A | 3/1996 | Marum et al. | |
| 5,656,524 A | 8/1997 | Eklund et al. | |
| 5,837,571 A | 11/1998 | Pathak | |
| 6,040,968 A | 3/2000 | Duvvury et al. | |
| 6,169,309 B1 | 1/2001 | Teggatz et al. | |
| 6,424,013 B1 | 7/2002 | Steinhoff et al. | |
| 2005/0056896 A1 | 3/2005 | Manna et al. | |
| 2007/0170524 A1 * | 7/2007 | Liu et al. | 257/401 |

OTHER PUBLICATIONS

The American Heritage College Dictionary, Fourth Edition, Houghton Mifflin Company, 2004, p. 1188.*
Sze, S. M.; "Physics of Semiconductor Devices"; 1981; John Wiley & Sons; Second Edition; pp. 453-456.*

* cited by examiner

*Primary Examiner* — Stephen W Smoot
*Assistant Examiner* — Vicki B Booker
(74) *Attorney, Agent, or Firm* — Warren L. Franz; Wade J. Brady, III; Frederick J. Telecky, Jr.

(57) ABSTRACT

The present invention relates to electrostatic discharge (ESD) protection circuitry. Multiple techniques are presented to adjust one or more ends of one or more fingers of an ESD protection device so that the ends of the fingers have a reduced initial trigger or breakdown voltage as compared to other portions of the fingers, and in particular to central portions of the fingers. In this manner, most, if not all, of the adjusted ends of the fingers are likely to trigger or fire before any of the respective fingers completely enters a snapback region and begins to conduct ESD current. Consequently, the ESD current is more likely to be distributed among all or substantially all of the plurality of fingers rather than be concentrated within one or merely a few fingers. As a result, potential harm to the ESD protection device (e.g., from current crowding) is mitigated and the effectiveness of the device is improved.

9 Claims, 16 Drawing Sheets

US 8,110,462 B2

REDUCED FINGER END MOSFET BREAKDOWN VOLTAGE (BV) FOR ELECTROSTATIC DISCHARGE (ESD) PROTECTION

This application is a divisional of application Ser. No. 10/852,967, filed May 25, 2004, now U.S. Pat. No. 7,034,364.

FIELD OF INVENTION

The present invention relates generally to the art of semiconductor devices, and more particularly to improved MOSFET electrostatic discharge (ESD) protection devices having reduced finger end breakdown voltages (BV).

BACKGROUND OF THE INVENTION

Electrostatic discharge (ESD) is a continuing problem in the design and manufacture of semiconductor devices. Integrated circuits (ICs) can be damaged by ESD events stemming from a variety of sources, in which large currents flow through the device. In one such ESD event, a packaged IC acquires a charge when it is held by a human whose body is electrostatically charged. An ESD event occurs when the IC is inserted into a socket, and one or more of the pins of the IC package touch the grounded contacts of the socket. This type of event is known as a human body model (HBM) ESD stress. For example, a charge of about 0.6 µC can be induced on a body capacitance of 150 pF, leading to electrostatic potentials of 4 kV or greater. HBM ESD events can result in a discharge for about 100 nS with peak currents of several amperes to the IC. Another source of ESD is from metallic objects, known as the machine model (MM) ESD source, which is characterized by a greater capacitance and lower internal resistance than the HBM ESD source. The MM ESD model can result in ESD transients with significantly faster rise times than the HBM ESD source. A third ESD model is the charged device model (CDM), which involves situations where an IC becomes charged and discharges to ground. In this model, the ESD discharge current flows in the opposite direction in the IC than that of the HBM ESD source and the MM ESD source. CDM pulses also typically have very fast rise times compared to the HBM ESD source.

ESD events typically involve discharge of current between one or more pins or pads exposed to the outside of an integrated circuit chip. Such ESD current flows from the pad to ground through vulnerable circuitry in the IC, which may not be designed to carry such currents. Many ESD protection techniques have been thus far employed to reduce or mitigate the adverse effects of ESD events in integrated circuit devices. Many conventional ESD protection schemes for ICs employ peripheral dedicated circuits to carry the ESD currents from the pin or pad of the device to ground by providing a low impedance path thereto. In this way, the ESD currents flow through the protection circuitry, rather than through the more susceptible circuits in the chip.

Such protection circuitry is typically connected to I/O and other pins or pads on the IC, wherein the pads further provide the normal circuit connections for which the IC was designed. Some ESD protection circuits carry ESD currents directly to ground, and others provide the ESD current to the supply rail of the IC for subsequent routing to ground. Rail-based ESD protection devices can be employed to provide a bypass path from the IC pad to the supply rail (e.g., VDD) of the device. Thereafter, circuitry associated with powering the chip is used to provide such ESD currents to the ground. Local ESD protection devices are more common, however, wherein the ESD currents are provided directly to ground from the pad or pin associated with the ESD event. Individual local ESD protection devices are typically provided at each pin on an IC, with the exception of the ground pin or pins.

One common technique for creating local ESD protection devices for protection of metal-oxide semiconductor (MOS) ICs is to create an N-channel MOS transistor device (NMOS), in which a parasitic bipolar transistor (e.g., a lateral NPN, or LNPN) associated with the NMOS device turns on to conduct ESD currents from the pad to ground. The bipolar transistor is formed from the NMOS device, wherein the P-type doped channel between the drain and source acts as the NPN base, and the N-type drain and source act as the bipolar collector and emitter, respectively. Typically, the drain of the NMOS is connected to the pad or pin to be protected and the source and gate are tied to ground. Current flowing through the substrate to ground creates a base to emitter voltage (Vbe) sufficient to turn on the bipolar device, whereby further ESD current flows from the drain (collector) at the pad to the grounded source (emitter).

The parasitic bipolar transistor (LNPN) operates in a snapback region when the ESD event brings the potential of the pad or pin positive with respect to ground. In order to provide effective ESD protection, it is desirable to provide an LNPN having a low trigger voltage to begin snapback operation, as well as a high ESD current capability within the snapback region. In practice, the LNPN enters the snapback region of operation upon reaching an initial trigger voltage Vt1 having a corresponding current It1. Thereafter, the LNPN conducts ESD current to ground to protect other circuitry in the IC, so long as the ESD current does not exceed a second breakdown current level It2 with a corresponding voltage Vt2. If the ESD stress currents exceed It2, thermal runaway is induced in the ESD protection device, wherein the reduction of the impact ionization current is offset by the thermal generation of carriers. This breakdown is initiated in a device under stress as a result of self-heating, and causes failure of the ESD protection device, allowing ESD currents to potentially damage other circuitry in the IC. To avoid such ESD protection device failure and the associated IC damage, it is therefore desirable to provide ESD protection devices having high It2 breakdown current ratings.

To achieve high breakdown current ratings, such devices typically include multiple fingers or clamps, which are effectively parallel transistors among which the ESD current is distributed or shared. One problem with such multi-finger devices is found where respective initial trigger voltages Vt1 differ slightly among the different transistors or fingers. In this situation, one or merely a few fingers of the device may turn on, causing this portion of the device to operate in snapback mode. Thereafter, the remaining fingers may not reach Vt1 due to the snapback operation of the triggered finger(s). As a result, the full ESD current conduction capability for the LNPN is not utilized, and the current may exceed second breakdown levels for the finger (or relatively few fingers) operating in the snapback region, resulting in thermal device failure. Accordingly, it would be desirable to provide a multi-finger ESD protection device where the plurality of fingers trigger concurrently so as to mitigate current crowding and potential resulting damage to the ESD protection device.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

The present invention relates to electrostatic discharge (ESD) protection circuitry. Multiple techniques are presented to adjust one or more ends of one or more fingers of an ESD protection device so that the ends of the fingers have a reduced initial trigger or breakdown voltage as compared to other portions of the fingers, and in particular to central portions of the fingers. In this manner, most, if not all, of the treated ends of the fingers are likely to trigger or fire before any of the respective fingers completely enter a snapback region and begin to conduct ESD current. Consequently, the ESD current is more likely to be distributed among all or substantially all of the plurality of fingers rather than be concentrated within one or merely a few fingers. As a result, potential harm to the ESD protection device (e.g., from current crowding) is mitigated and the effectiveness of the device is improved.

According to one or more aspects of the present invention, an ESD protection device operative to protect an associated integrated circuit from an ESD event is disclosed. The device includes a MOS transistor device comprising a plurality of elongate or longitudinally extending source/drain regions that form fingers. At least some portion of one or more end regions of the fingers has a dopant characteristic that varies relative to respective middle regions of the fingers. In this manner, the varied end regions have an initial trigger voltage that is lower than a trigger voltage at the middle regions of the fingers.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 1b is a sectional side elevation view illustrating an NMOS transistor and associated lateral bipolar NPN (LNPN) transistor operating in the ESD protection device depicted in FIG. 1a.

DETAILED DESCRIPTION OF THE INVENTION

Figure 1A:
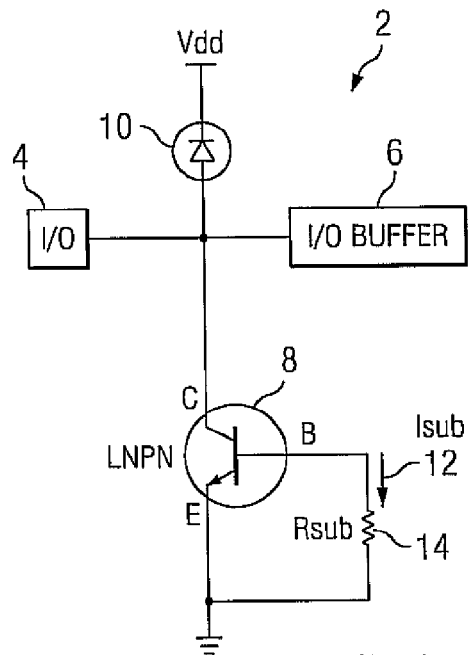
FIG. 1a is a schematic diagram illustrating an I/O pin of an integrated circuit (IC) operatively coupled to an NPN electrostatic discharge (ESD) protection device for protecting the IC during an ESD event.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and/or devices are shown in block diagram form in order to facilitate describing one or more aspects of the present invention.

The invention relates to electrostatic discharge (ESD) protection devices, and more particularly to treatments for ESD devices that improve their performance and reliability. In particular, one or more end regions of one or more fingers of an ESD protection device are treated so that the ends of these fingers fire before any of the fingers begin to completely conduct ESD current. The treatment lowers the initial triggering voltage Vt1 of the ends of the fingers as compared to the triggering voltages of the middle regions of the fingers. In this manner, ESD current is more likely to be spread out among all or substantially all of the fingers rather than be crowded or concentrated within one or merely a few fingers that enter a snapback region.

Referring initially to FIG. 1a, a portion of an integrated circuit 2 is illustrated schematically with an I/O pad 4 for connection of an I/O buffer circuit 6 with external devices or circuitry (not shown). An ESD protection LNPN 8 is provided to conduct ESD currents from the pad 4 to ground. A diode 10 may optionally be included to provide ESD currents to a power supply rail Vdd in combination with the LNPN 8. During an ESD event, a substrate current Isub 12 flows from the collector C of the LNPN 8 through a substrate resistance Rsub 14, thereby creating a base voltage Vbe at the base B and turning the LNPN 8 on. The LNPN 8 then conducts ESD current from the pad 4 at collector C to the grounded emitter E in snapback operation to protect the I/O buffer 6 and other circuitry in the IC 2 from ESD damage.

Figure 1B:
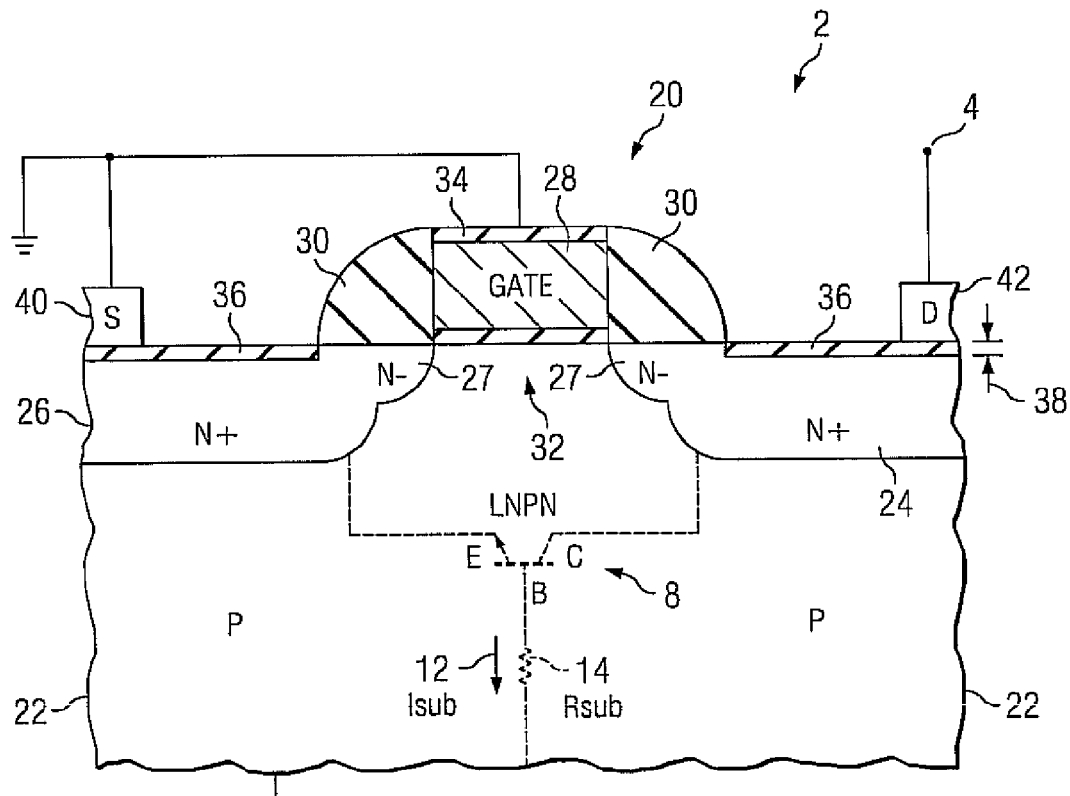

As further illustrated in FIG. 1b, the LNPN 8 (illustrated in dashed lines) is formed from portions of an NMOS transistor 20. The NMOS 20 is formed from a substrate 22 doped with P-type dopants, in which N-type drain and source regions 24 and 26 are created, respectively. For example, the regions 24 and 26 are implanted in the substrate 22 with N+ dopants and may further comprise lightly doped (e.g., N−) areas 27 partially underlying a gate 28. The gate 28 comprises a polysilicon structure 30 overlying a P-type channel region 32 in the substrate between the drain and source regions 24 and 26. The gate 28 includes a silicide region 34 by which the gate 28 is grounded in the configuration shown. The upper portions of the drain and source regions 24 and 26 also include silicide regions 36 (which are optional), wherein the silicide 36 and 34 have a thickness 38. The source region 26 is grounded through the silicide 36 in the present configuration and a contact 40, and the drain region 24 is connected to the pad 4 (FIG. 1a) via a contact 42.

The lateral NPN bipolar transistor (LNPN) 8 of FIG. 1a is formed from the NMOS device 20, wherein the N-type drain region 24 acts as the collector C, the N-type source region 26 functions as the emitter E, and the P type channel region 32 therebetween functions as the base B of the LNPN 8. During an ESD event, ESD current travels from the drain contact 42 at the pad 4, through the substrate 22 toward the ground, creating the substrate current Isub 12. This current Isub 12, in turn, causes a voltage across the substrate resistance Rsub 14 which turns on the bipolar LNPN 8.

Figure 1C:
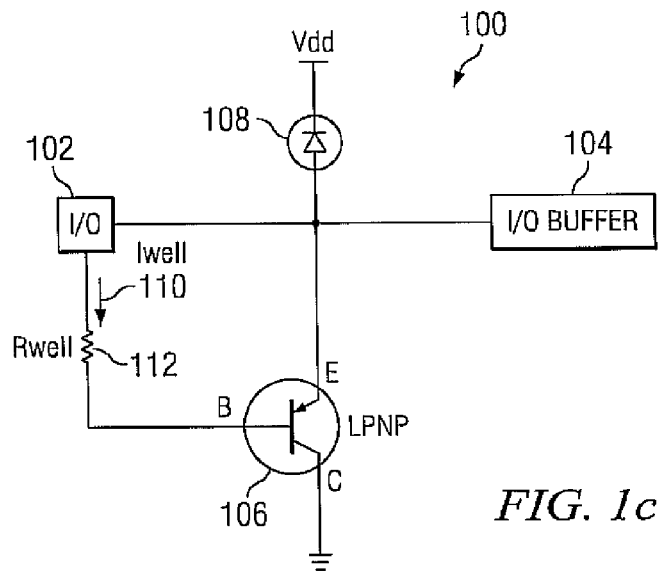
FIG. 1c is another schematic diagram illustrating an I/O pin of an IC operatively coupled to a PNP based ESD protection device for protecting the IC during an ESD event.
Figure 1D:
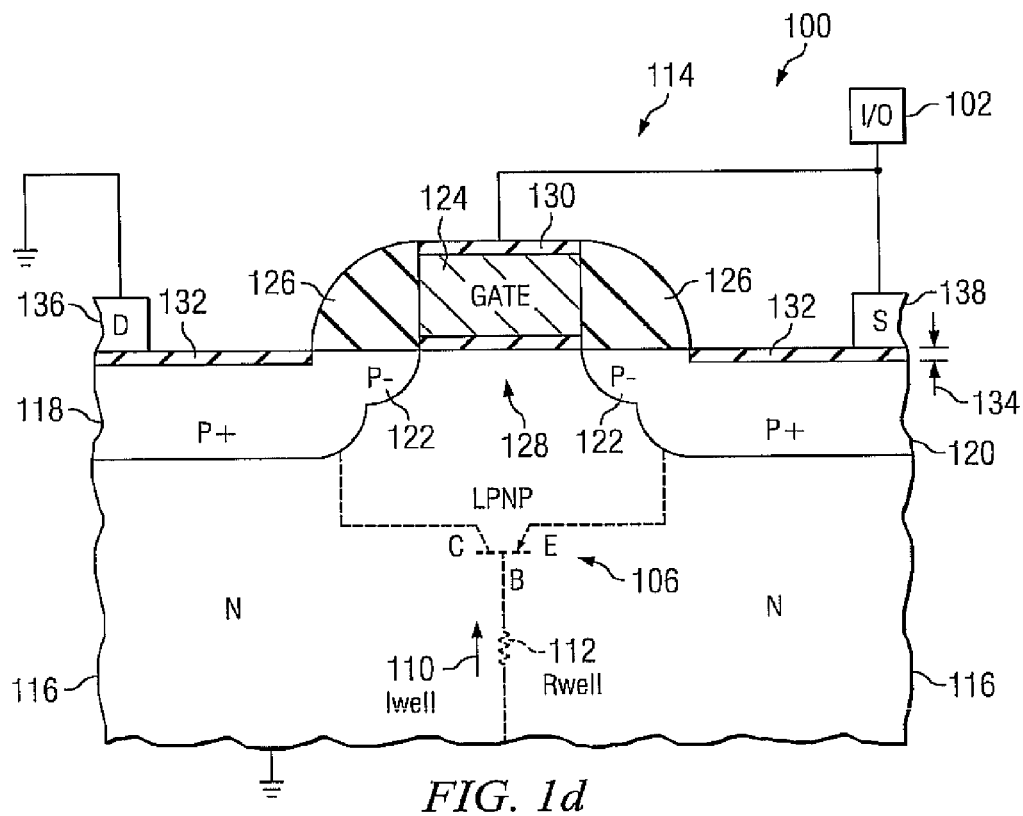
FIG. 1d is a sectional side elevation view illustrating a PMOS transistor and associated lateral bipolar PNP (LPNP) transistor operating in the ESD protection device depicted in FIG. 1c.

FIGS. 1c and 1d are similar to FIGS. 1a and 1b except that they illustrate a PMOS, rather than an NMOS implementation. As with the NMOS case, in the PMOS scenario, a portion of an integrated circuit 100 is illustrated schematically with an I/O pad 102 for connection of an I/O buffer circuit 104 with devices or circuitry (not shown). It will be appreciated, however, that P-channel MOS (PMOS) transistor devices have not conventionally been used in electrostatic discharge (ESD) protection devices due to, among other things, increased voltages that can result in high power dissipation and poor ESD protection. However, as noted by the inventors of the present invention, device scaling and the corresponding shrinking of device dimensions have allowed the behavior of the PMOS device to become suitable for use in ESD protection devices as snapback is occurring at reasonable levels. As a result, PMOS devices can now be utilized in ESD protection devices while enjoying the intrinsic advantages associated with PMOS devices, such as a relatively low level of power dissipation, for example.

As with the NMOS implementation, the PMOS device is implemented in a manner designed to protect metal-oxide semiconductor (MOS) integrated circuits (ICs), among other things, wherein a parasitic bipolar transistor (e.g., a lateral PNP, or LPNP) associated with the PMOS device turns on to conduct ESD currents from a pad to ground. The bipolar transistor is formed from the PMOS device, wherein the N-type doped channel between a drain and source of the transistor acts as the PNP base, and the P-type drain and source act as a bipolar collector and emitter, respectively. Typically, the source, gate and well tie of the PMOS are connected to the pad or pin to be protected and the drain is tied to ground. Current flowing through the well to the drain creates a base to emitter voltage (Vbe) sufficient to turn on the bipolar device, whereby further ESD current flows from the source (emitter) at the pad to the grounded drain (collector).

Accordingly, an ESD protection LPNP 106 is provided in FIG. 1c that acts to conduct ESD currents from the pad 102 to ground. A diode 108 may optionally be included to provide ESD currents to a power supply rail Vdd in combination with the LPNP 106. During an ESD event, a well current Iwell 110 flows from the well contact of the LPNP 106 through a well resistance Rwell 112, thereby creating a base voltage Vbe at the base B and turning the LPNP 106 on. The LPNP 106 then conducts ESD current from the pad 102 at emitter E to the grounded collector C in snapback operation to protect the I/O buffer 104 and other circuitry in the IC 100 from ESD damage.

As further illustrated in FIG. 1d, the LPNP 106 (depicted in phantom) is formed from portions of a PMOS transistor 114. The PMOS 114 is formed from a substrate 116 doped with N-type dopants, in which P-type drain and source regions 118 and 120 are created, respectively. For example, the regions 118 and 120 are implanted in the substrate 116 with P+ dopants and may further comprise lightly doped (e.g., P−) areas 122 partially underlying a gate 124. The gate 124 comprises, for example, a polysilicon structure 126 overlying an N-type channel region 128 in the substrate between the drain and source regions 118 and 120. The gate 124 includes a silicide region 130 by which the gate 124 may be connected to the pad. The upper portions of the drain and source regions 118 and 120 also include silicide regions 132 (which are optional), wherein the silicide 130 and 132 have a thickness 134. In the example shown, the drain region 118 is grounded through the silicide 132 and a contact 136, and the source region 120 is connected to the pad 102 via a contact 138 as is the gate 124 and substrate or well region 116.

It will be appreciated that the lateral PNP bipolar transistor (LPNP) 106 of FIG. 1c is formed from the PMOS device 114, wherein the P-type source region 120 acts as the emitter E, the P-type drain region 118 functions as the collector C, and the N type channel region 128 there-between functions as the base B of the LPNP 106. During an ESD event, ESD current travels from the well contact at the pad 102, through the well 116 toward the ground, creating the well current Iwell 110. This current Iwell 110, in turn, causes a voltage across the well resistance Rwell 112 that turns on the bipolar LPNP 106.

Figure 2A:
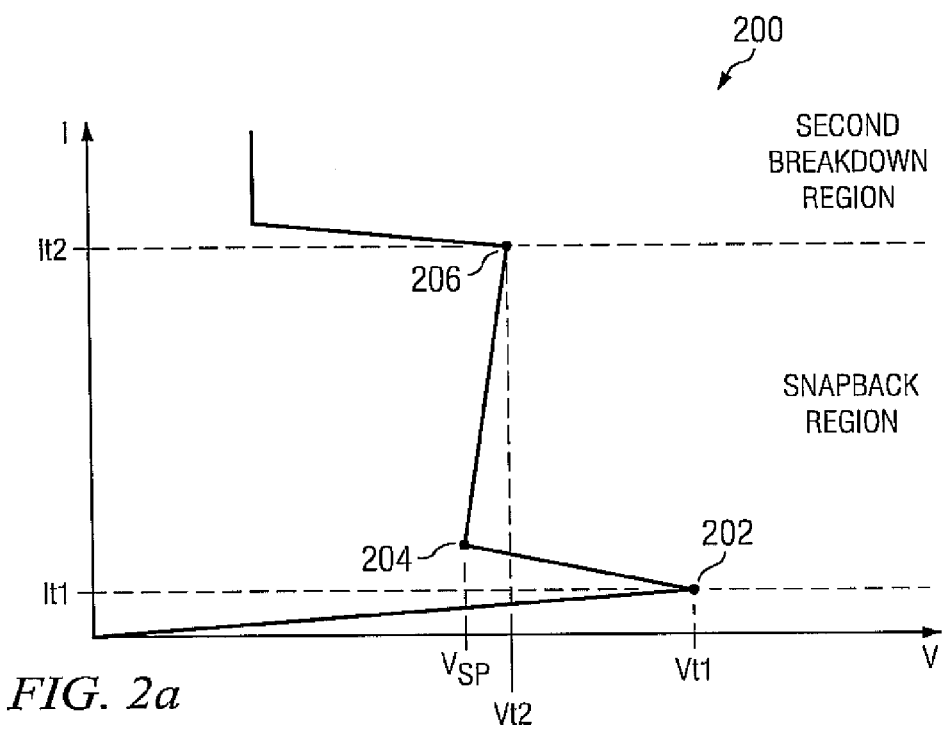
FIG. 2a is a graph illustrating a current versus voltage curve for a finger of an ESD protection device.
Figure 2B:
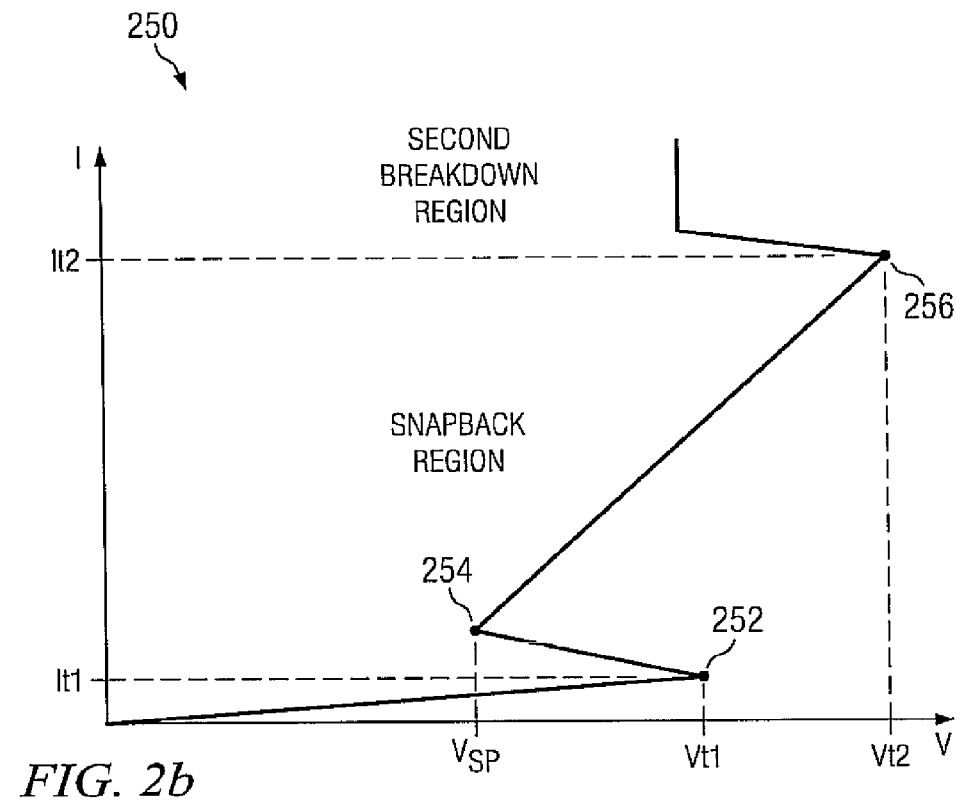
FIG. 2b is a graph illustrating a more desirable current versus voltage curve for a finger of an ESD protection device.

Turning to FIGS. 2a and 2b exemplary current vs. voltage curves 200 and 250 are illustrated. The curves 200 and 250 correspond to ESD current conduction within a finger of an NMOS or PMOS based ESD protection device where an associated LNPN or LPNP, respectively, operates to conduct ESD currents in a snapback region, and may undergo thermal failure if operated in a second breakdown region. In FIG. 2a, for example, the LNPN or LPNP (e.g., LNPN 8 of FIGS. 1a and 1b or LPNP 106 of FIGS. 1c and 1d) conducts along the curve 200 until an initial trigger voltage Vt1 202 (e.g., the breakdown voltage of the ESD finger 20 or 114) is reached at a current of It1, after which the voltage drops to a snapback voltage Vsp 204. The device then conducts ESD currents up to a current level It2 at a corresponding voltage Vt2 206, after which the device enters a second breakdown region where thermal breakdown may likely occur.

In the curve 200 of FIG. 2a, it is noted that the voltage level Vt1 202 is greater than Vt2 206. As discussed above, this situation can cause undesirable operation of ESD protection devices having multi-finger architectures, wherein one or more of the fingers fail to enter the snapback region by virtue of other fingers entering snapback. In particular, one or a few fingers that trigger at Vt1 may operate within the snapback region and begin to fully conduct ESD current before the other fingers reach Vt1. That is, breakdown occurs and current spreads along the length of the finger, with the reduced snapback voltage causing other fingers to not break down. In this manner, the ESD current is not shared among all or substantially all of the fingers, but rather is "crowded" within a single or merely a few fingers. Further, the triggered fingers may reach the thermal breakdown voltage Vt2 before the other fingers reach the initial triggering voltage Vt1 or go into snapback. The ESD protection device may thus become damaged and/or less useful for ESD current conduction.

Referring now to FIG. 2b, a somewhat more desirable current versus voltage curve 250 is illustrated. In particular, a LNPN or LPNP finger for an NMOS or PMOS based ESD protection device respectively conducts ESD current until an initial trigger or breakdown voltage Vt1 252 is reached at a current of It1, after which the voltage drops to a snapback voltage Vsp 254. The device then conducts ESD currents up to a current level It2 at corresponding voltage Vt2 256, after which the device enters a second breakdown region where thermal breakdown may occur. When the NMOS or PMOS operates in the snapback mode or the bipolar breakdown region, the LNPN or LPNP, respectively, conducts most of the drain terminal current. Since the initial trigger voltage Vt1 is less than Vt2, it is more likely that multiple fingers will trigger (e.g., reach Vt1) before those fingers that are already conducting ESD current reach the secondary or thermal breakdown voltage Vt2. The ESD current is thus more likely to be shared among more fingers, and the ESD protection device is consequently more likely to be able to conduct a greater amount of ESD current before becoming susceptible to thermal damage. It will be appreciated, however, that while it may be desirable to set Vt2 as high as possible, Vt1 need not be less than Vt2 to facilitate multiple finger firing to mitigate current crowding.

In accordance with one or more aspects of the present invention, and as illustrated and described below, the composition of one or more ends of one or more fingers is selectively altered, at least relative to other portions of the fingers, to lower the initial triggering voltage Vt1 of the finger ends as compared to central portions of the fingers to facilitate finger end triggering or firing before any of the fingers begin to completely conduct ESD current (e.g., by entering the snapback region). The composition of the finger ends can be adjusted, for example, by selectively controlling a source/drain doping activity. In this manner, all or substantially all of the fingers are more likely to fire and enter the snapback mode and conduct ESD current during an ESD event. Thus one or more aspects of the present invention facilitate ESD current distribution among multiple fingers of an ESD protection device and the resulting improved ESD protection afforded thereby.

By way of example, treating an ESD protection device that has 16 fingers, for example, according to one or more aspects of the present invention, can lower a trigger voltage to about 10.5 volts, down from a conventional voltage of about 15 volts. Similarly, treating an ESD protection device according to one or more aspects of the present invention facilitates scalability. For example, a device having 8 fingers may have an HBM damage voltage of about 5 kV, whereas a device having twice as many fingers (e.g., 16) may have a damage voltage that is essentially doubled or about 10 kV.

Figure 3A:
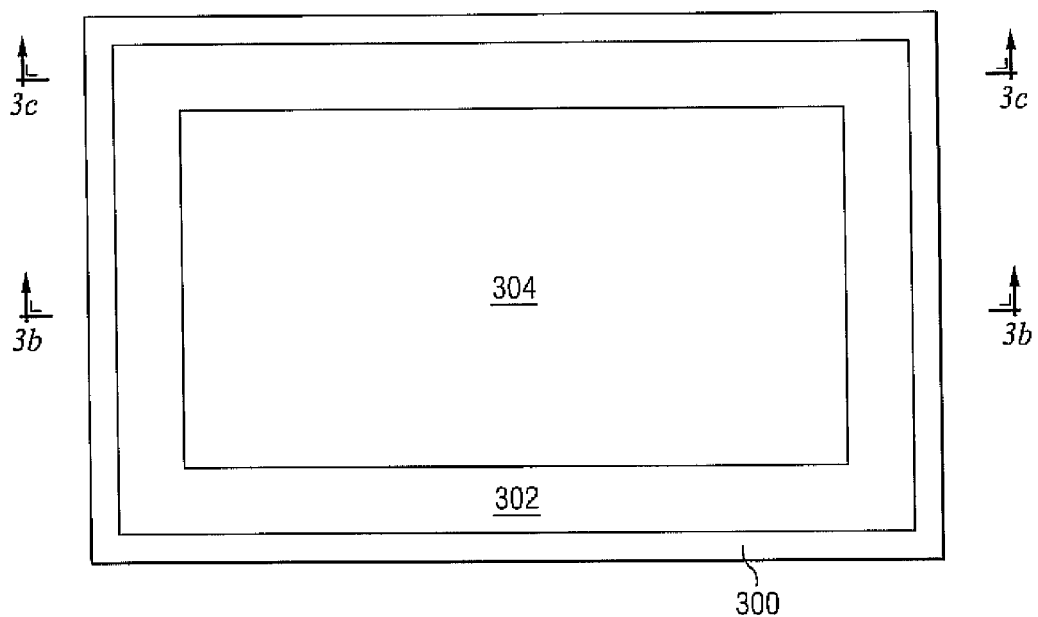
FIG. 3a is a top plan view illustrating a section of a semiconductor substrate whereon an ESD protection device can be fashioned in accordance with one or more aspects of the present invention.
Figure 3B:
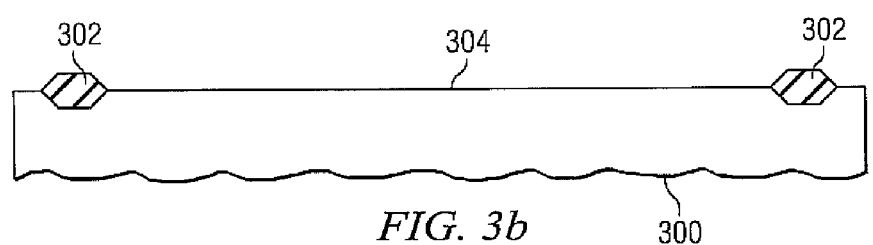
FIG. 3b is a cross sectional side view of the structure depicted in FIG. 3a taken along line 3b-3b.
Figure 3C:
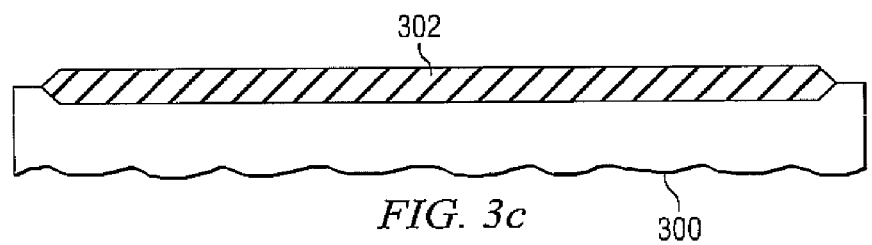
FIG. 3c is a cross sectional side view of the structure depicted in FIG. 3a taken along line 3c-3c.

Referring now to FIGS. 3a, 3b and 3c, a portion of a substrate 300 upon which an ESD protection device can be fashioned in accordance with one or more aspects of the present invention is illustrated. FIG. 3a is a top plan view of the portion of the substrate 300, while FIGS. 3b and 3c are cross sectional views of the structure presented in FIG. 3a taken along lines 3b-3b and 3c-3c, respectively. The substrate 300 generally comprises silicon, and in the illustrated example has an insulating barrier 302 formed therein or thereon. The barrier 302 defines a moat 304 or region wherein source/drain doping may subsequently occur and ESD fingers may be formed. Such a barrier 302 may, for example, be formed from oxide based materials that are designed to electrically isolate active devices or regions from one another. To form such a barrier 302, portions of the substrate 300 may be selectively exposed via a mask (e.g., of silicon nitride) and/or etching, for example, and be allowed to oxidize, such as by local oxidation of silicon (LOCOS) processes, for example. Such oxidation may occur, for example, at about 950 degrees Celsius in the presence of steam in the span of about 230 minutes. The oxidized areas can have a thickness between about 4000 to about 7000 Angstroms, for example. Further, the moat region 304 may include an etched portion of the substrate and/or one or more etched portions of one or more other layers (not shown) formed on the substrate 300. Alternatively, the isolation region may comprise shallow trench isolation (STI), as may be desired.

Figure 4A:
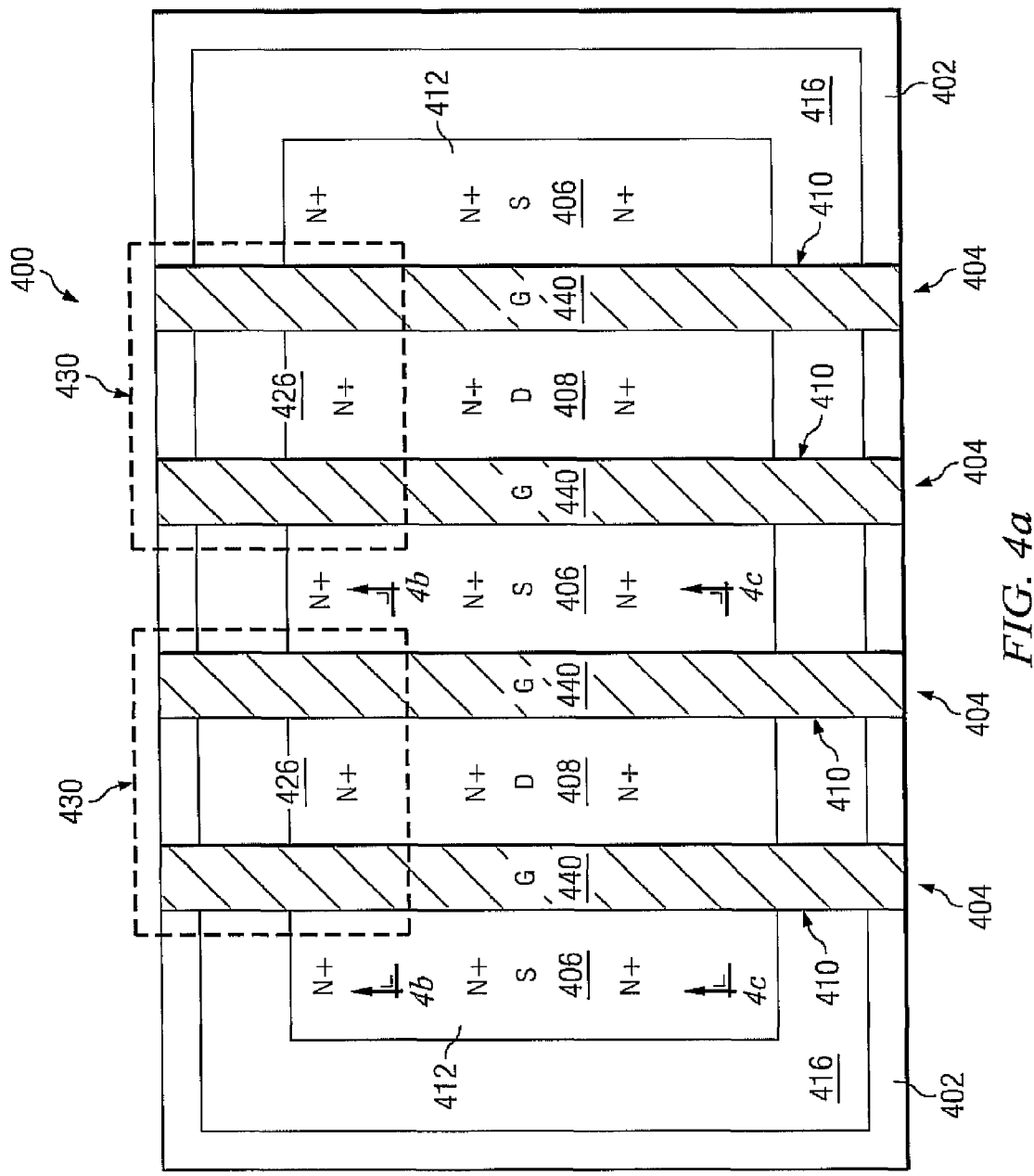
FIG. 4a is a top plan view illustrating a section of a semiconductor substrate whereon a plurality of fingers of an ESD protection device are fashioned utilizing respective NMOS structures in accordance with one or more aspects of the present invention.
Figure 4B:
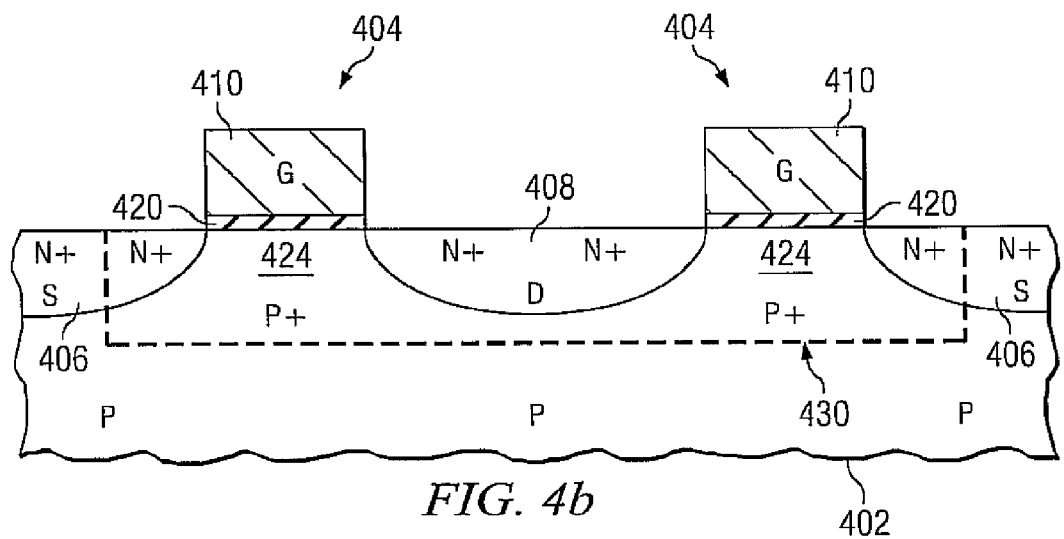
FIG. 4b is a cross sectional side view of the depiction presented in FIG. 4a taken along line 4b-4b.
Figure 4C:
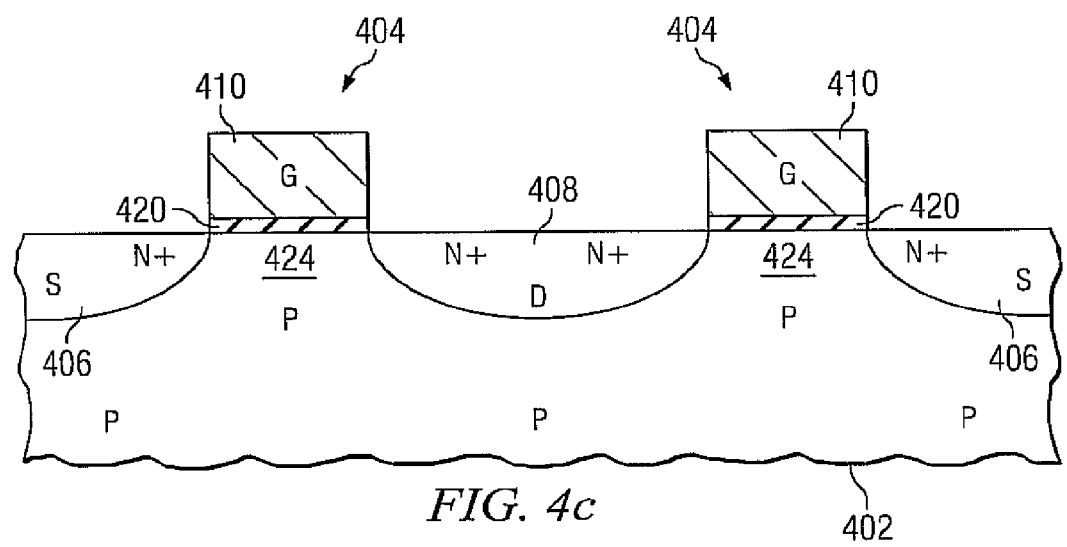
FIG. 4c is a cross sectional side view of the depiction presented in FIG. 4a taken along line 4c-4c.

Turning to FIGS. 4a, 4b and 4c, a portion of a multi-finger NMOS ESD protection device 400 that is formed on a semiconductor substrate or portion of a wafer 402 according to one or more aspects of the present invention is illustrated. FIG. 4a is a top plan view of the device 400, while FIGS. 4b and 4c are cross sectional views of fingers 404 of the device 400 taken along lines 4b-4b and 4c-4c, respectively, of FIG. 4a. The device 400 includes a plurality of source 406, drain 408 and gate regions 410 that comprise, in one example, generally elongate parallel regions. In the illustrated example, the source 406, drain 408 and gate regions 410 are formed within a moat region 412 defined within an insulative surrounding 416 on the substrate 402 such as that depicted in FIGS. 3a, 3b and 3c, for example.

Since the device 400 in the present example is an NMOS device, the source 406 and drain 408 regions are doped with an N-type dopant, such as arsenic or phosphorous, for example, to have an N+ composition. The source 406 and drain 408 regions may, for example, be doped with a dose of about $10^{15}/cm^2$ at an energy level of about 100 KeV. The substrate 402 generally comprises a silicon based material, and as can be seen in FIGS. 4*b* and 4*c*, can be doped with a P-type dopant, such as boron, for example, to have a P composition for the NMOS device. The gates 410 are generally formed from a polysilicon type material and typically comprise a relatively thin layer of substantially insulative dielectric material 420 immediately overlying channel regions 424 within the substrate 402 between respective source 406 and drain 408 regions. It will be appreciated that such gates 410 (as well as other gates referenced herein) may further comprise conductive contacts and insulative sidewall spacers (e.g., such as nitride based materials). Such sidewall spacers can be used, for example, in creating lightly doped drain (LDD) or extension regions in the drain 408 and/or source 406 regions. Such structures/features are not, however, depicted in the accompanying figures for purposes of simplicity and ease of understanding.

According to one or more aspects of the present invention, portions 430 of one or more end regions 426 of one or more of the fingers 404 receive a supplemental doping to more heavily dope the substrate or body region 402 within these portions. In the example illustrated in FIG. 4*a*, portions 430 of the end regions 426 receiving the supplemental doping are indicated in phantom. Similarly, the portion 430 of the body 402 of the end region 426 that receives supplemental doping in FIG. 4*b* is also outlined in phantom. It will be appreciated that FIG. 4*c* includes no indication of supplemental doping since FIG. 4*c* is taken along line 4*c*-4*c* in FIG. 4*a* which is drawn across mid-finger regions 440 that do not receive supplemental doping. It will also be appreciated that the supplemental doping occurs before the gate 410 and dielectric 420 layers are formed such that the supplemental dopants are not blocked by the gate structures. This can be seen in FIG. 4*b* where the distribution of the supplemental dopants 430 is substantially uniform and not affected by the gate and dielectric layers.

Where the body 402 of the NMOS device 400 is doped with a P-type dopant to have a P composition, the supplemental doping can increase the doping in the portions 430 of the end regions 426 so that they have a slightly P+ composition, for example. It will be appreciated, however, that the relative difference in doping between the body 402 and the more heavily doped portions 430 of the body is what's important. For example, the supplemental doping may similarly create P-type portions 430 where the body is originally doped to have a P minus composition. By way of example, the portions 430 of one or more of the end regions 426 may, for example, receive a supplemental doping of a P-type dopant, such as boron at a dose of about $10^{13}/cm^2$ and an energy level of about 300 KeV. Also, it will be appreciated that even though some or all of the source 406 and/or drain 408 regions may receive some of the supplemental doping, the drain and source regions are generally so heavily doped that the supplemental doping has an insubstantial effect on these regions and their compositions thus remain effectively the same (e.g., N+ in the NMOS device).

The altered dopant composition in the portions 430 of the body 402 due to the supplemental doping facilitates lowering the triggering voltage for the end regions 426 of the fingers 404. In this manner, the affected end regions 402 will be prone to fire more quickly than middle regions 440 of the fingers that receive no supplemental doping. Essentially, the trigger voltage Vt1 for the middle regions 440 of the fingers will remain slightly higher than the trigger voltage Vt1 for the end regions 426 of the fingers 404. Accordingly, it will be more likely that most, if not all, of the fingers 404 of the ESD protection device 400 will trigger before any respective fingers completely enter the snapback region and begin to conduct current.

It will be appreciated that greater or lesser areas of the finger ends 426 can be supplementally doped to achieve the desired firing or lowering of Vt1 in accordance with one or more aspects of the present invention. For example, while the supplementally doped portions 430 reach into the source regions 406 in the example presented in FIGS. 4*a* and 4*b*, the doping does not have to extend into these regions. Similarly, the portions 430 do not have to cover the entirety of drain regions 408 at the ends 426 of the fingers 404. Rather, the supplemental doping may only cover fractional portions of the drain regions 408 to effectively lower the trigger voltage of the end regions 426 of the fingers 404. By way of example, where the gates 410 have respective widths of about 61 micrometers and lengths of about 2.5 micrometers, the supplemental dopant may only have to extend in or cover about 5 micrometers of the end of the drain regions 408. Further, it will be appreciated that both ends of respective fingers 404 may receive supplemental doping to lower Vt1 at these ends and facilitate concurrent ESD current conduction within the fingers.

Figure 5A:
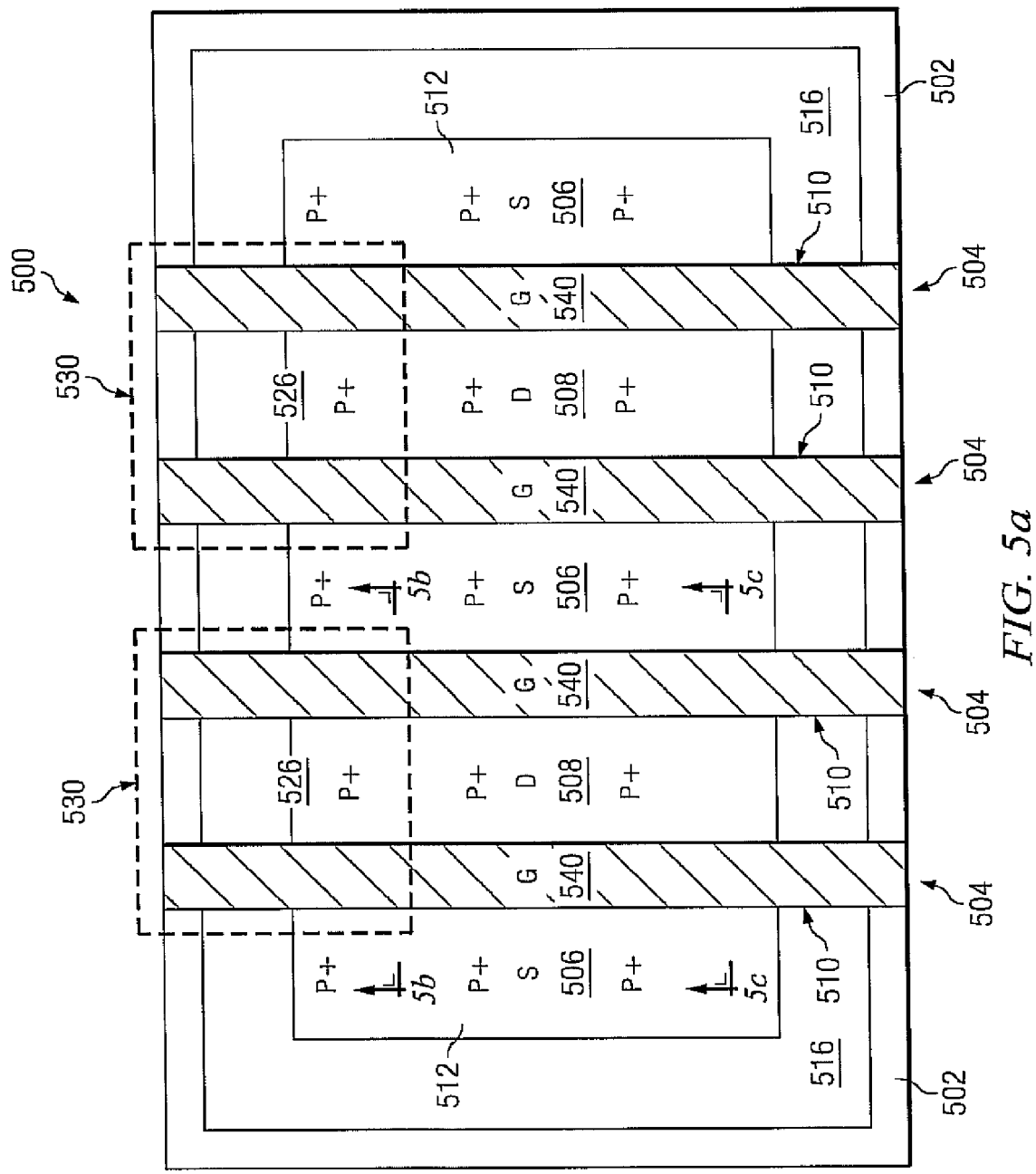
FIG. 5a is a top plan view illustrating a section of a semiconductor substrate whereon a plurality of fingers of an ESD protection device are fashioned utilizing respective PMOS structures in accordance with one or more aspects of the present invention.
Figure 5B:
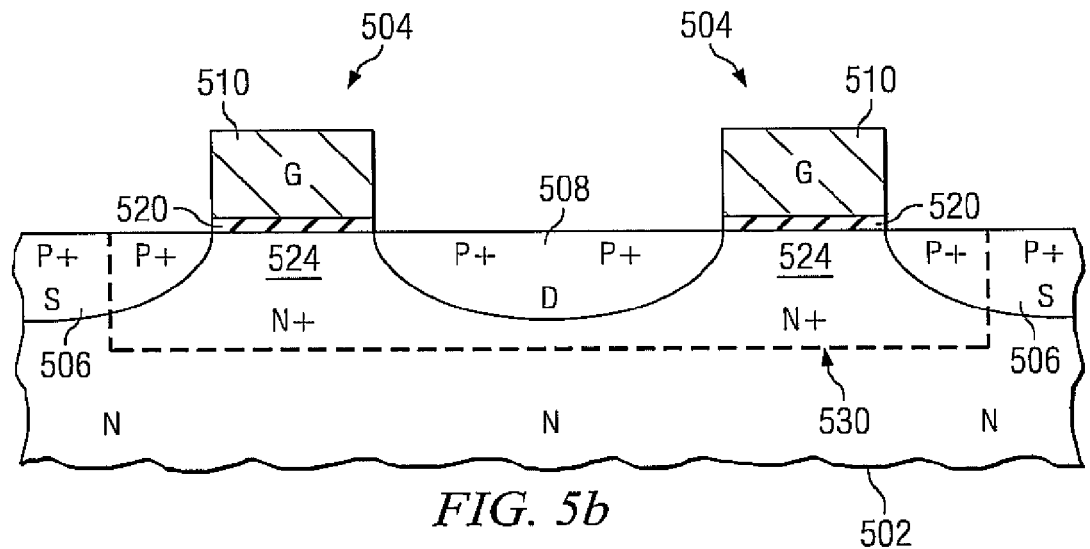
FIG. 5b is a cross sectional side view of the depiction presented in FIG. 5a taken along line 5b-5b.
Figure 5C:
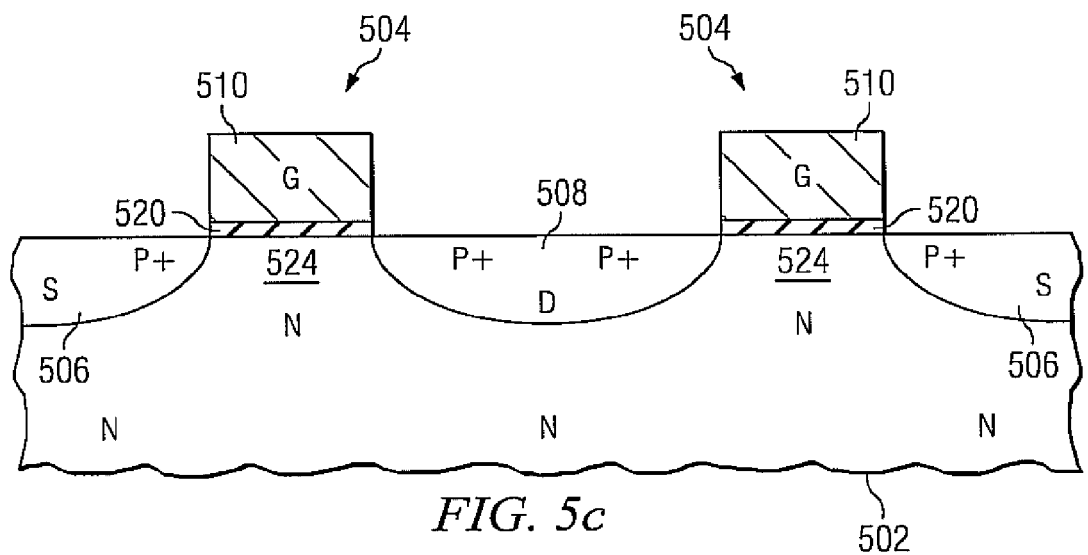
FIG. 5c is a cross sectional side view of the depiction presented in FIG. 5a taken along line 5c-5c.

Turning to FIGS. 5*a*, 5*b* and 5*c* an ESD protection device 500 is illustrated that is treated in accordance with one or more aspects of the present invention. The device is similar to the device 400 presented in FIGS. 4*a*, 4*b* and 4*c* except that it is for a PMOS based device rather than an NMOS based device. Accordingly, FIG. 5*a* is a top plan view of the device 500, while FIGS. 5*b* and 5*c* are cross sectional views of fingers 504 of the device 500 taken along lines 5*b*-5*b* and 5*c*-5*c*, respectively, of FIG. 5*a*. As with device 400, device 500 includes a plurality of source 506, drain 508 and gate regions 510 that are generally elongate parallel regions. In the illustrated example, the source 506, drain 508 and gate regions 510 are formed within a moat region 512 defined within an insulative surrounding 516 on the substrate 502.

Since the device 500 is a PMOS device, the source 506 and drain 508 regions are doped with a P-type dopant, such as boron, for example, to have a P+ composition. The source 506 and drain 508 regions may, for example, be doped with a dopant dose of about $10^{14}/cm^2$ at an energy level of about 60 KeV. The substrate 502 generally comprises a silicon based material, and as can be seen in FIGS. 5*b* and 5*c*, can be doped with an N-type dopant, such as phosphorous or arsenic, for example, to have an N composition for the PMOS device 500.

According to one or more aspects of the present invention, portions 530 of one or more end regions 526 of one or more of the fingers 504 can receive a supplemental doping to more heavily dope the substrate or body region 502 within these portions. The supplementally doped portions 530 are outlined in phantom in FIGS. 5*a* and 5*b*. In the PMOS device, the supplemental doping can change doping within the portions 530 to N+ from N or to N from N minus, for example. This difference in dopant concentration facilitates lowering the triggering voltage for the end regions 526 of the fingers 504. In this manner, the end regions 526 will be prone to fire more quickly than middle regions 540 of the fingers 504 that do not receive such supplemental doping. Accordingly, most, if not all, of the fingers 504 of the ESD protection device 500 will likely trigger before any of the respective fingers enter the snapback region and begin to completely conduct current.

Also, as with device 400, greater or lesser areas of the finger ends 526 can be supplementally doped to achieve the desired firing. For example, the supplemental doping does not have to extend into the source regions 506. Similarly, the supplemental doping may only cover a portion of the drain regions 508 to effectively lower the trigger voltage of the end regions 526 of the fingers 504. By way of example, the supplemental dopant may only have to extend in to cover about 5 micrometers of the end of the drain regions 508. The portions 530 may, for example, receive a supplemental doping of an N-type dopant, such as phosphorous and/or arsenic, at a concentration of about 1013/cm2 and an energy level of about 300 KeV, for example, to obtain the desired composition within the body 502.

Figure 6A:
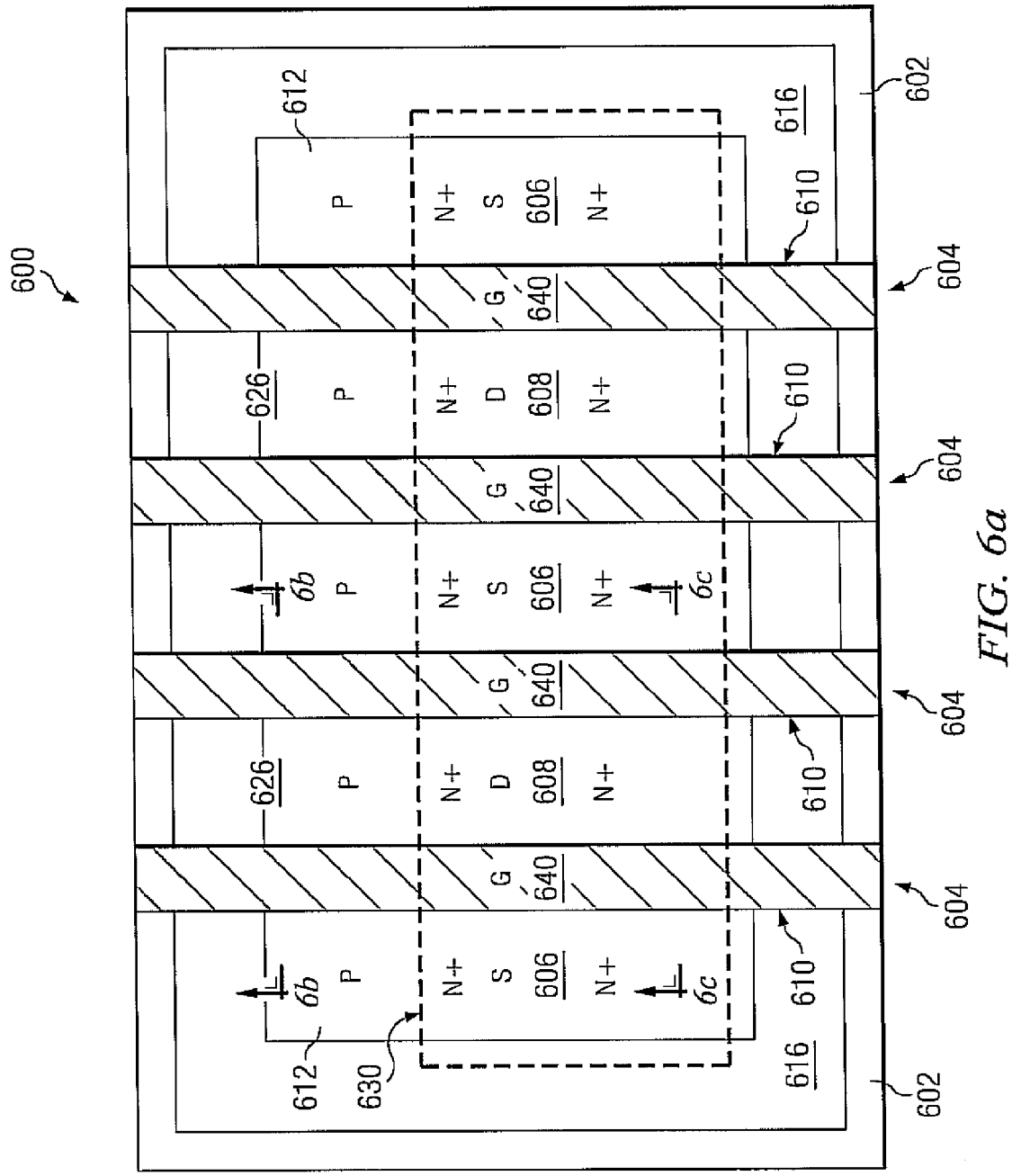
FIG. 6a is a top plan view illustrating a section of a semiconductor substrate whereon a plurality of fingers of an ESD protection device are fashioned utilizing respective NMOS structures in accordance with one or more other aspects of the present invention.
Figure 6B:
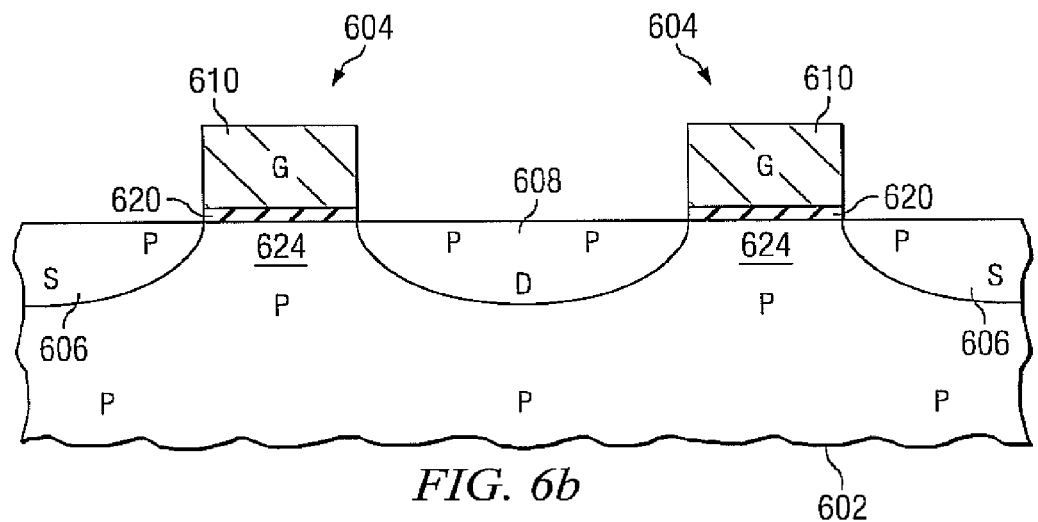
FIG. 6b is a cross sectional side view of the depiction presented in FIG. 6a taken along line 6b-6b.
Figure 6C:
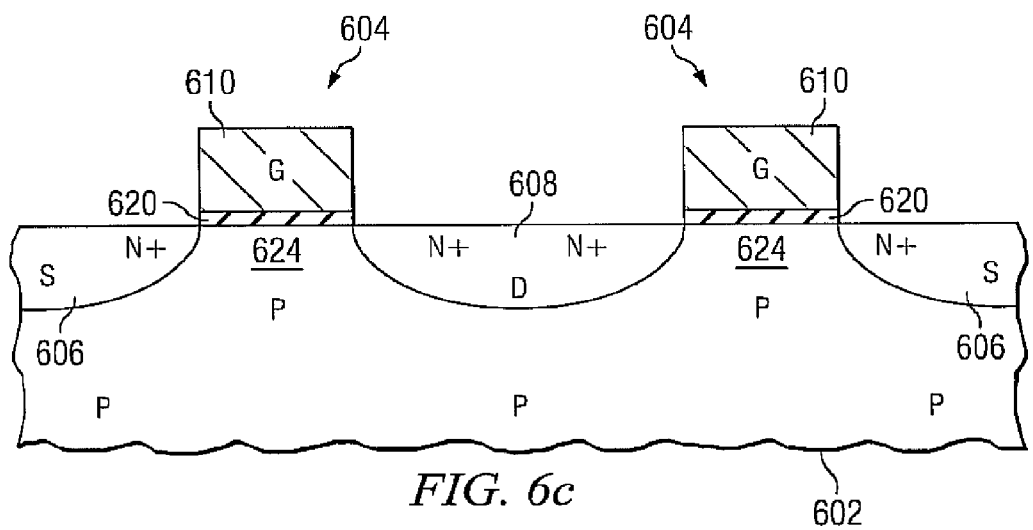
FIG. 6c is a cross sectional side view of the depiction presented in FIG. 6a taken along line 6c-6c.

FIGS. 6a, 6b and 6b also illustrate an ESD protection device 600 operative to conduct ESD current in accordance with one or more aspects of the present invention. The device 600 is an NMOS device similar to the devices 400 and 500 presented in FIGS. 4a, 4b and 4c and FIGS. 5a, 5b and 5c, respectively, having a plurality of generally elongate parallel source 606, drain 608 and gate regions 610 formed within a moat region 612 defined within an insulative surrounding 616 on a substrate 602, where FIG. 6a is a top plan view of the device 600, while FIGS. 6b and 6c are cross sectional views of fingers 604 of the device 600 taken along lines 6b-6b and 6c-6c, respectively, of FIG. 6a. However, unlike devices 400 and 500, supplemental doping is not implemented to alter end regions 626 of fingers 604 of the device 600 so that the end regions trigger before middle regions 640 of the fingers 604.

Instead of supplemental doping the end regions 626, source/drain dopant that is normally applied to the source 606 and drain 608 regions is pulled in (as depicted in phantom 630) so that end regions 626 have a dopant composition different from that of more central regions 640 of the fingers 604. The dopant may, for example, be pulled in so that about 5 micrometers of the end regions 626 that formerly would have received source/drain doping, are no longer doped. The adjusted application of the dopant can be achieved in any suitable manner, such as by photolithographic and/or other techniques, for example. Additionally, since the device 600 is a PMOS device, the source 606 and drain 608 regions are doped with an N-type dopant, such as arsenic or phosphorous, for example, to have an N+ composition (FIGS. 6a and 6c). The source 406 and drain 408 regions may, for example, be doped with a dopant concentration of about $10^{14}/cm^2$ at an energy level of about 60 KeV. The substrate 602 can be doped with a P-type dopant, such as boron, for example, to have a P composition for the NMOS device.

However, unlike devices 400 and 500, as shown in FIGS. 4b and 5b, end regions 626 receive no supplemental doping. Rather, the end regions 626 have a dopant composition different from that of central regions 640 of the fingers 604 by virtue of a lack of source/drain doping. In particular, the more central regions 640 of the fingers 604 remain exposed to the normal source/drain doping such that these source 606 and drain 608 regions have an N+ composition for the NMOS device (FIG. 6c), whereas the source 606 and drain 608 regions at the end regions 626 merely possess doping corresponding to any previous treatment of the substrate or body 602 (FIG. 6b).

In the example illustrated, the body 602 in the end regions 626 has a P-type composition (FIGS. 6a and 6b). The doping contrast within the body 602 between the end regions 626 of the fingers 604 and the middle regions 640 of the fingers at the source 606 and drain 608 regions provides a relatively sharp corner on the drain to body interface that facilitates breakdown and lowering of the triggering voltage for the end regions 626 of the fingers 604. In this manner, the end regions 626 will be prone to fire more quickly than doped middle portions 640 of the fingers. Essentially, the trigger voltage Vt1 for the middle portions 640 of the fingers will remain slightly higher than the trigger voltage Vt1 for the end portions 626 of the fingers 604. Accordingly, it will be more likely that most, if not all, of the fingers 604 of the ESD protection device 600 will trigger before any respective fingers 604 begin to fully conduct ESD current by entering the snapback region.

Figure 7A:
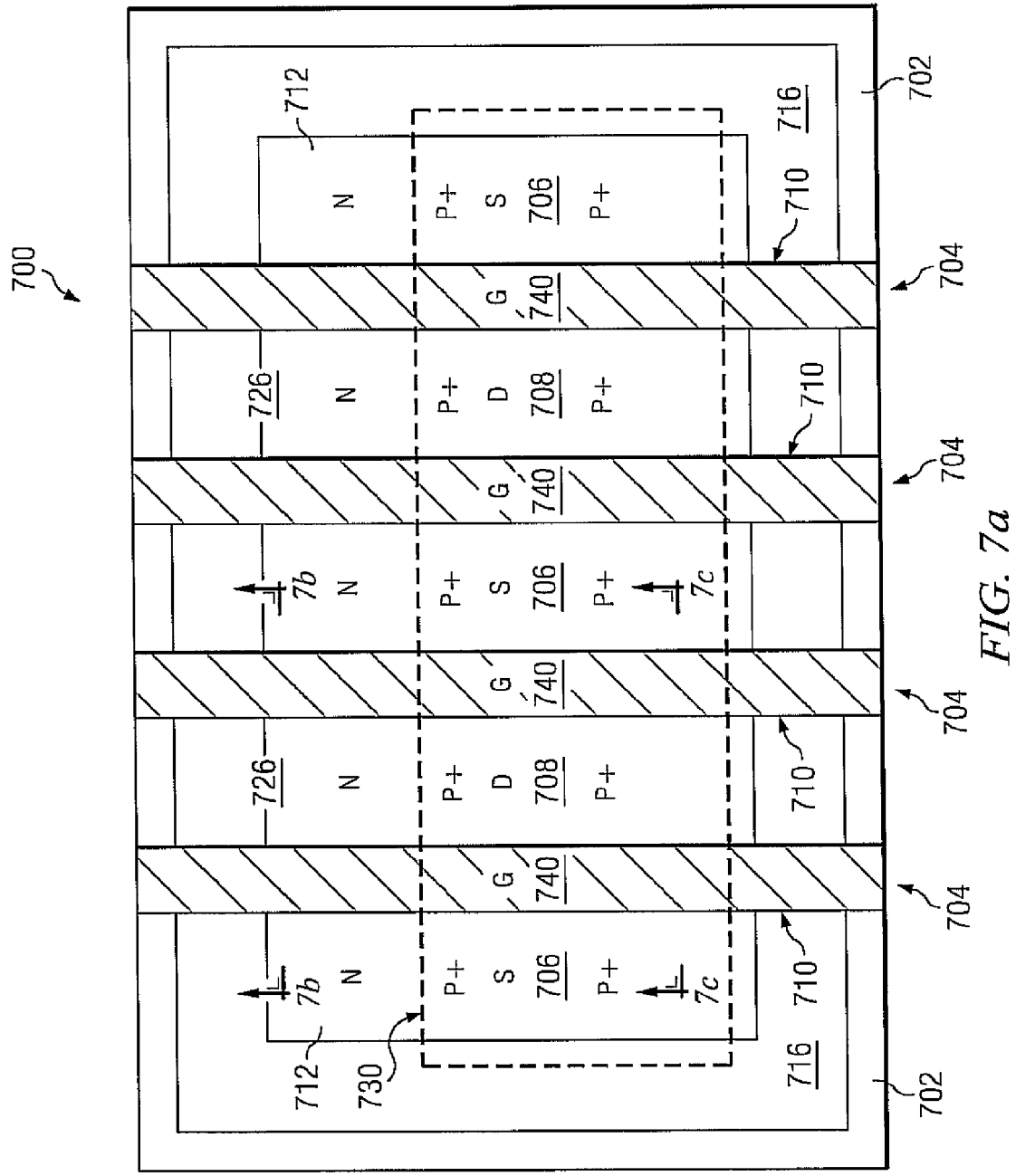
FIG. 7a is a top plan view illustrating a section of a semiconductor substrate whereon a plurality of fingers of an ESD protection device are fashioned utilizing respective PMOS structures in accordance with one or more other aspects of the present invention.
Figure 7B:
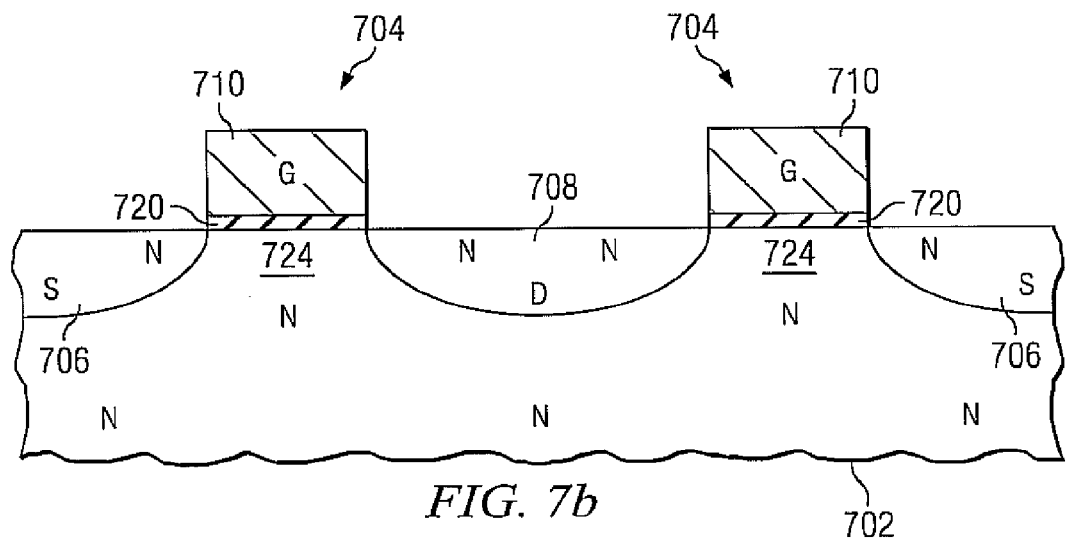
FIG. 7b is a cross sectional side view of the depiction presented in FIG. 7a taken along line 7b-7b.
Figure 7C:
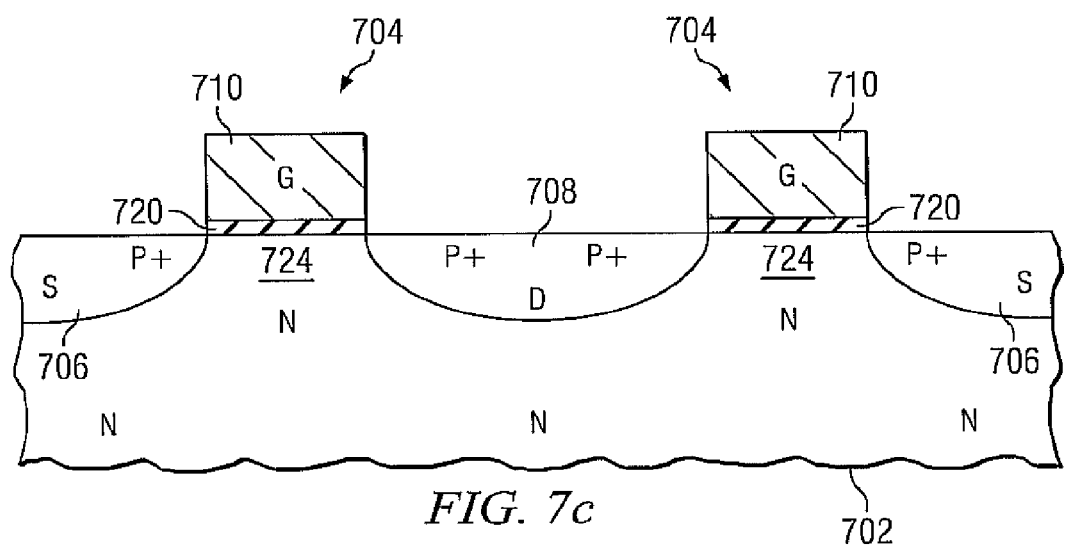
FIG. 7c is a cross sectional side view of the depiction presented in FIG. 7a taken along line 7c-7c.

FIGS. 7a, 7b and 7c similarly illustrate pulling in source/drain dopants to alter end regions 726 of one or more fingers 704 of an ESD protection device 700. However, FIGS. 7a, 7b and 7c depict a PMOS device rather than an NMOS based device as presented in FIGS. 6a, 6b and 6c. As with device 600, ESD protection device 700 has a plurality of generally elongate parallel source 706, drain 708 and gate regions 710 formed within a moat region 712 defined within an insulative surrounding 716 on a substrate 702, where FIG. 7a is a top plan view of the ESD protection device 700, while FIGS. 7b and 7c are cross sectional views of fingers 704 of the device 700 taken along lines 7b-7b and 7c-7c, respectively, of FIG. 7a.

Since device 700 is a PMOS based ESD protection device, P-type source/drain dopants, such as boron, for example, are pulled in (as depicted in phantom 730) so that about 5 micrometers of the end regions 726 are not doped. In this manner, end portions of the source 706 and drain 708 regions have an N composition corresponding to that of the doped substrate 702 (FIGS. 7a and 7b). More centralized regions 740 of the fingers 704, on the other hand, receive the normal source/drain doping to have a P+ composition (FIGS. 7a and 7c). The different dopings mitigate current crowding by lowering Vt1 at the end regions 726 of the fingers 704

Figure 8A:
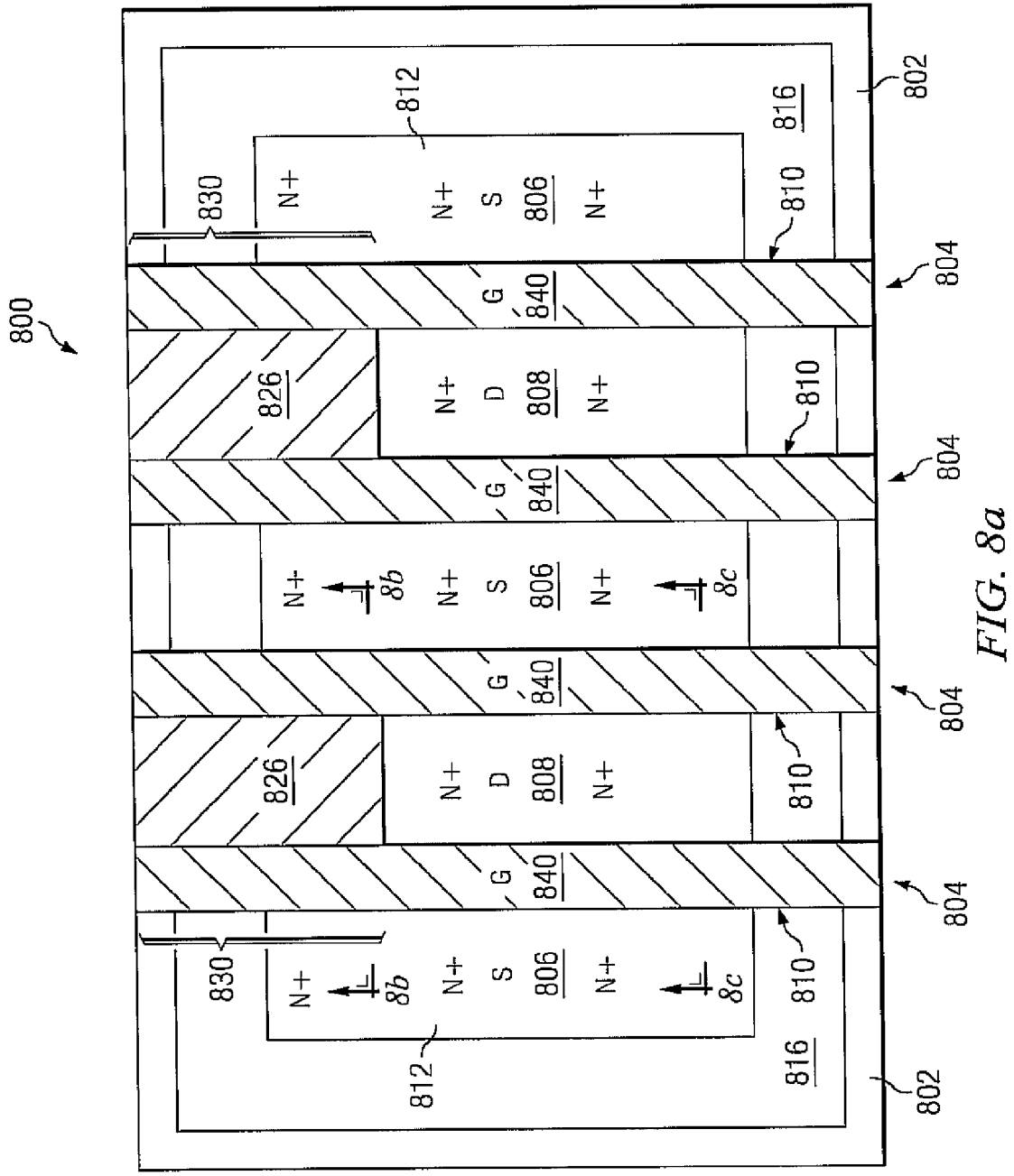
FIG. 8a is a top plan view illustrating a section of a semiconductor substrate whereon a plurality of fingers of an ESD protection device are fashioned utilizing respective NMOS structures in accordance with one or more further aspects of the present invention.
Figure 8B:
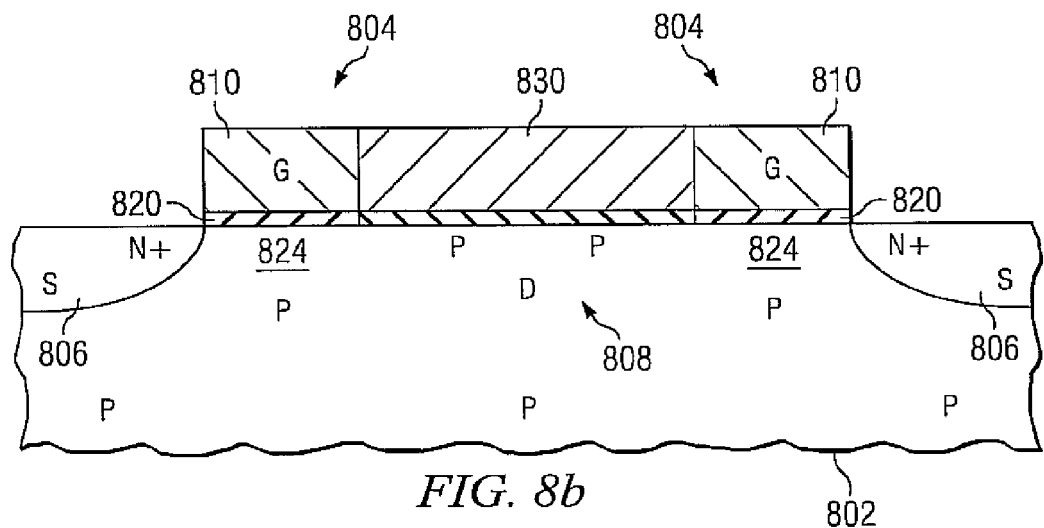
FIG. 8b is a cross sectional side view of the depiction presented in FIG. 8a taken along line 8b-8b.
Figure 8C:
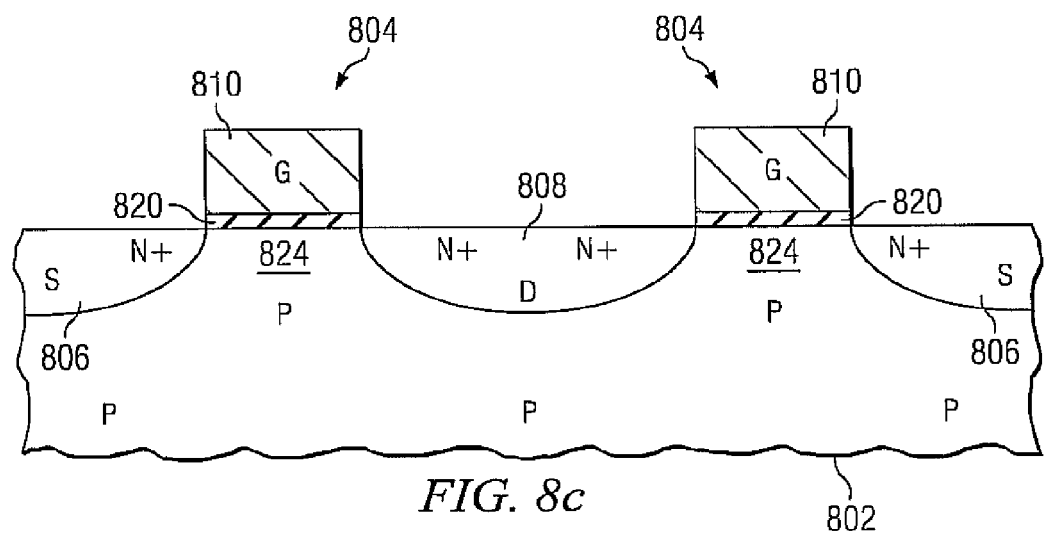
FIG. 8c is a cross sectional side view of the depiction presented in FIG. 8a taken along line 8c-8c.

FIGS. 8a, 8b and 8c further illustrate an ESD protection device 800 treated in accordance with one or more aspects of the present invention to lower a triggering voltage of one or more end regions 826 of one or more fingers 804 of the device 800. However, rather than supplemental doping or repositioning source/drain dopings as depicted in FIGS. 4a, 4b and 4c and 5a, 5b and 5c and FIGS. 6a, 6b and 6c and 7a, 7b and 7c, respectively, portions 830 of the end regions 826 of the fingers are covered with a material 830 to inhibit source/drain dopants from entering the substrate at these locations. An NMOS based device 800 is depicted where FIG. 8a is a top plan view of the ESD protection device 800, while FIGS. 8b and 8c are cross sectional views of fingers 804 of the device 800 taken along lines 8b-8b and 8c-8c, respectively, of FIG. 8a.

As with the other devices referenced herein, ESD protection device 800 has a plurality of generally elongate parallel source 806, drain 808 and gate regions 810 formed within a moat region 812 defined within an insulative surrounding 816 on a substrate 802. Being an NMOS device, the ESD protection device is doped so that source 806 and drain 808 regions have an N+ composition. Additionally, the substrate 802 or body of the device 800 is doped to have a P-type dopant composition.

In the example illustrated, about 5 micrometers of drain area at ends 826 of the fingers 804 have a P composition corresponding to that of the P doped substrate 802 due to the overlying material 830. Material 830 can, for example, be formed from the same material utilized to form (polysilicon) gates 810. The layer of gate material would simply not be removed (e.g., etched away) at this location 830 during gate formation, and would block source/drain dopants from entering the substrate 802 at these locations. A substantially sharp implant is thus obtained within the body 802 at the interface of the doped mid regions 840 of the fingers 804 and the covered portions 830 of the end regions 826 of the fingers 804. A sharp corner/dopant profile created thereby facilitates breakdown and lowering of the initial triggering voltage Vt1 at the affected end regions 826 of the fingers 804.

Figure 9A:
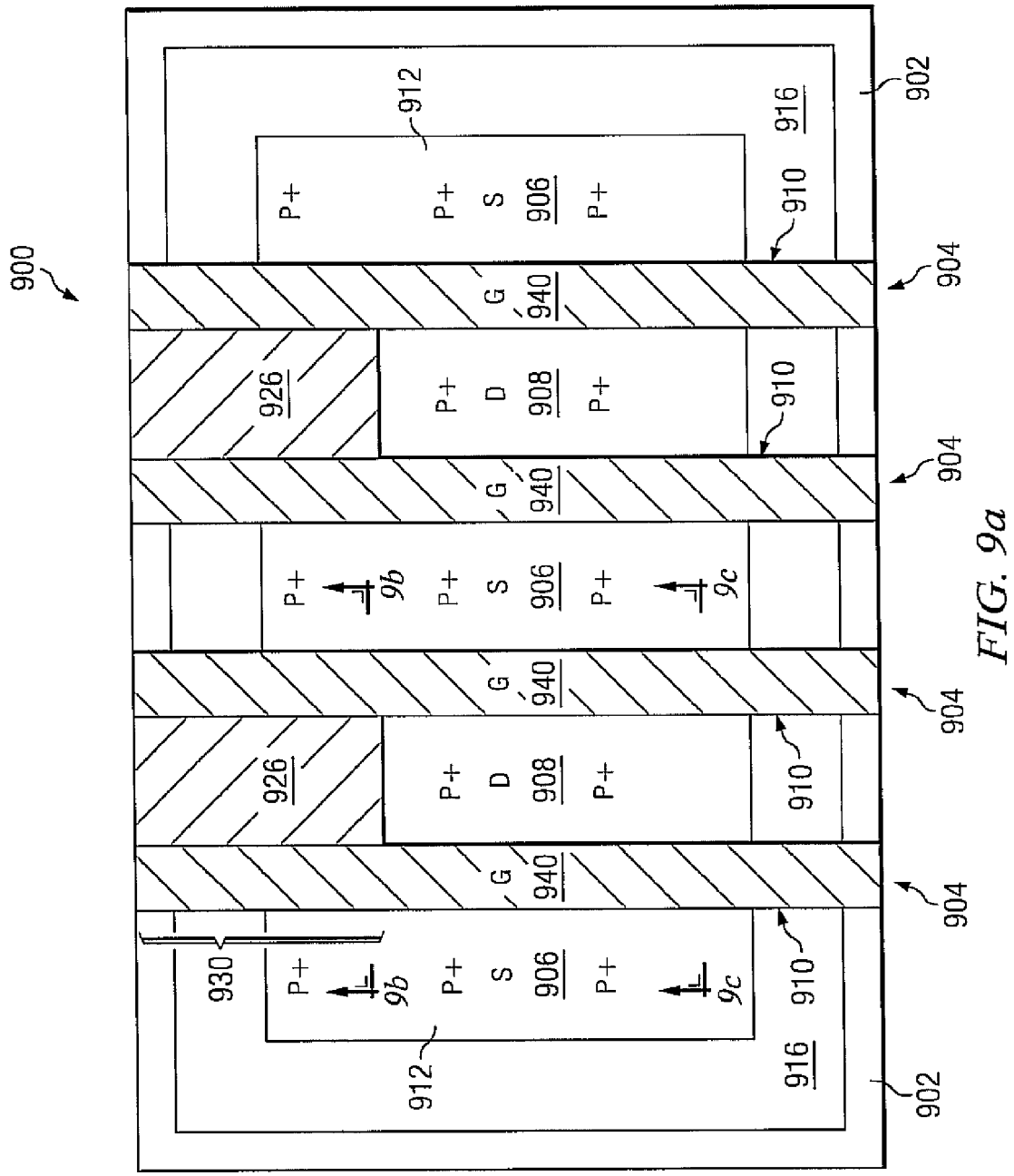
FIG. 9a is a top plan view illustrating a section of a semiconductor substrate whereon a plurality of fingers of an ESD protection device are fashioned utilizing respective PMOS structures in accordance with one or more further aspects of the present invention.
Figure 9B:
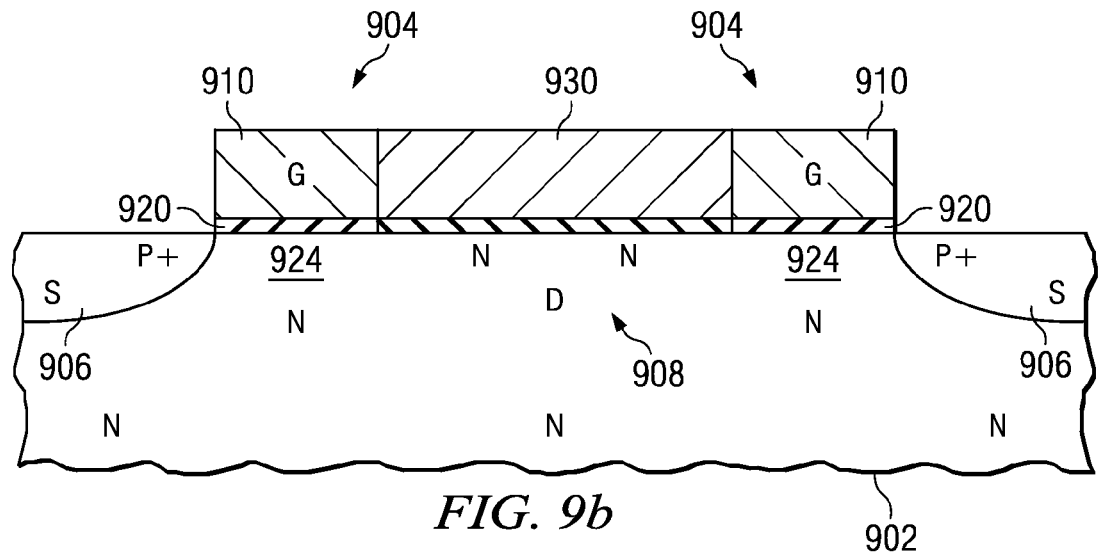
FIG. 9b is a cross sectional side view of the depiction presented in FIG. 9a taken along line 9b-9b.
Figure 9C:
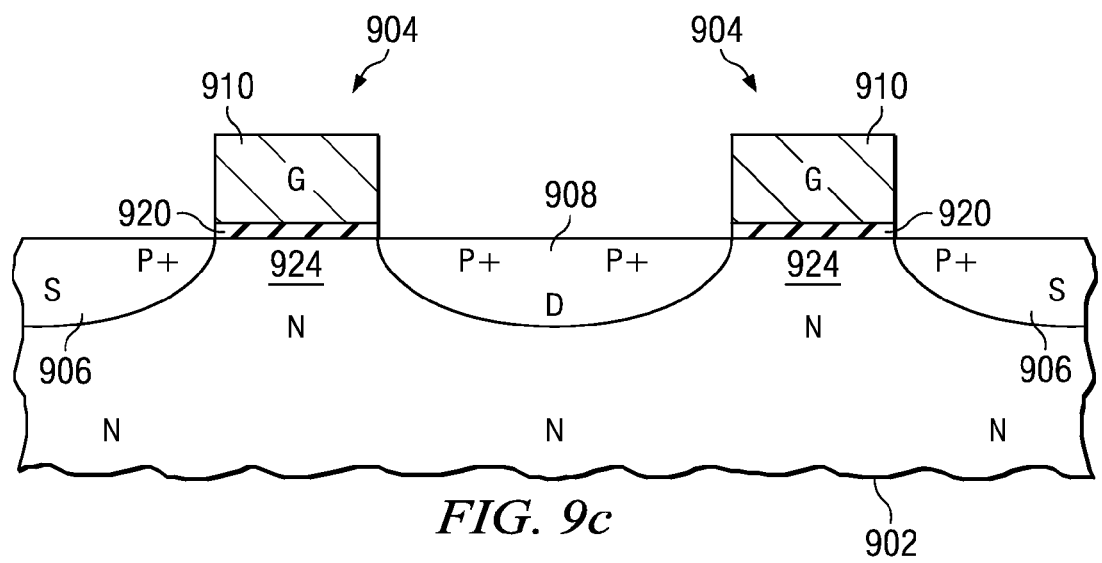
FIG. 9c is a cross sectional side view of the depiction presented in FIG. 9a taken along line 9c-9c.

FIGS. 9a, 9b and 9c similarly illustrate a material 930 overlying about 5 micrometers, for example, of a drain 908 region at one or more ends 926 of one or more fingers 904 of an ESD protection device 900 to lower initial triggering voltages and mitigate current crowding. The device 900 is a PMOS based ESD protection device, however, and has a plurality of generally elongate parallel source 906, drain 908 and gate regions 910 formed within a moat region 912 defined within an insulative surrounding 916 on a substrate 902. As with the other examples, FIG. 9a is a top plan view of the ESD protection device 900, while FIGS. 9b and 9c are cross sectional views of fingers 904 of the device 900 taken along lines 9b-9b and 9c-9c, respectively, of FIG. 9a.

The source 906 and drain 908 regions have a P+ composition from source/drain doping, while a portion of drain regions under (gate) material 930 has an N composition (FIG. 9b) corresponding to that of the doped substrate 902. P-type dopants, such as boron, for example, can be applied to the source 906 and drain 908 regions, while the substrate 902 can be doped with phosphorous and/or arsenic. The difference in dopant composition within the body 902 at the interface of the end 926 and the middle 940 regions of the fingers 904 provides a substantially sharp dopant profile that facilitates breakdown and lowering of the triggering voltage at the affected end regions 926 of the fingers 904 to facilitate concurrent ESD current conduction.

Although the invention has been shown and described with respect to one or more implementations, equivalent alterations and modifications will occur to others skilled in the art upon the reading and understanding of this specification and the annexed drawings. In addition, while a particular feature of the invention may have been disclosed with respect to one of several implementations, such feature may be combined with one or more other features of the other implementations as may be desired and advantageous for any given or particular application. It will be appreciated that the term substrate is intended to include a semiconductor substrate, a semiconductor epitaxial layer deposited or otherwise formed on a substrate and/or any other type of semiconductor body regardless of its composition and/or manner of manner of creation. Furthermore, to the extent that the terms "includes", "including", "has", "having", "with", or variants thereof are used in either the detailed description or the claims, such terms are intended to be inclusive in a manner similar to the term "comprising." Also, the term "exemplary" is intended to mean an example, rather than the best.

What is claimed is:

1. A method of forming an integrated circuit including an ESD protection device, comprising:
    forming a plurality of source regions, drain regions and gates in or on generally elongate parallel finger regions of a semiconductor substrate defined within a moat region surrounded by an insulating barrier on the substrate; the gates comprising dielectric material overlying channel regions within the substrate between respective ones of the source and drain regions, and conductive material overlying the dielectric material;
    wherein the semiconductor substrate is doped to have a net one of an N or P conductivity type; the source and drain regions are doped to have a net other of the N or P conductivity type; and at least a portion of a respective end region of one or more of the substrate finger regions is doped to provide a higher net doping of the one of the N or P conductivity type than a corresponding net doping of a corresponding respective middle region of the same one or more finger regions, so that the end region with the higher net doping is provided with an initial trigger voltage that is lower than a trigger voltage at the corresponding middle region;
    wherein the semiconductor substrate is provided with an initial doping of the one of the N or P conductivity type; and forming the plurality of source regions, drain regions and gates includes providing a supplemental doping of the one of the N or P conductivity type at the portion of the end region; and
    wherein the supplemental doping is provided prior to formation of the gates.

2. The method of claim 1, wherein the supplemental doping covers only a fractional portion of the drain region of the respective end region.

3. The method of claim 1, wherein the supplemental doping is applied to at least a portion of respective end regions of both ends of the one or more of the substrate finger regions.

4. A method of forming a multi-finger MOS ESD protection device, comprising:
    providing a moat region of first conductivity type laterally surrounded by an insulating barrier in a substrate;
    forming a plurality of generally parallel elongated gates at spaced positions extending over the moat region;
    doping the moat region with dopant of second conductivity type to form generally parallel elongated source and drain regions of second conductivity type on opposite sides of the gates, separated by channel regions of the moat region of first conductivity type defined under the gates between the source and drain regions; and
    prior to forming the gates, supplementally doping the moat region at end regions of the channel regions, thereby providing greater doping concentration of the first conductivity type at the end regions than in other regions of the channel regions.

5. The method of claim 4, wherein supplementally doping the moat region also includes supplementally doping at least portions of end regions of the drain regions, thereby providing greater doping concentration of the first conductivity type at the supplementally doped portions of the end regions of the drain regions than in other regions of the drain regions.

6. The method of claim 5, wherein supplementally doping the moat region also includes supplementally doping at least portions of end regions of the source regions, thereby providing greater doping concentration of the first conductivity type at the supplementally doped portions of the end regions of the source regions than in other regions of the source regions.

7. The method of forming a multi-finger MOS ESD protection device, comprising:
    providing a moat region of first conductivity type laterally surrounded by an insulating barrier in a substrate;
    forming a plurality of generally parallel elongated gates at spaced positions extending over the moat region;
    doping the moat region with dopant of second conductivity type to form generally parallel elongated source and drain regions of second conductivity type on opposite sides of the gates, separated by channel regions of the moat region of first conductivity type defined under the gates between the source and drain regions; and
    supplementally doping the moat region across the full channel length of end regions at least one end of the channel regions, thereby providing greater doping concentration of the first conductivity type at the supplementally doped end regions of the channel regions than in other regions of the channel regions;
    wherein supplementally doping the moat region also includes supplementally doping at least portions of end regions of the drain regions, thereby providing greater doping concentration of the first conductivity type at the supplementally doped portions of the end regions of the drain regions than in other regions of the drain regions.

8. The method of claim 7, wherein supplementally doping the moat region also includes supplementally doping at least portions of end regions of the source regions, thereby providing greater doping concentration of the first conductivity type at the supplementally doped portions of the end regions of the source regions than in other regions of the source regions.

9. A method of forming a multi-finger MOS ESD protection device, comprising:

providing a moat region of first conductivity type laterally surrounded by an insulating barrier in a substrate;

forming a plurality of generally parallel elongated gates at spaced positions extending over the moat regions;

doping the moat regions with dopant of second conductivity type to form generally parallel elongated source and drain regions of second conductivity type on opposite sides of the gates, separated by channel regions of the moat region of first conductivity type defined under the gates between the source and drain regions; and supplementally doping the moat regions at end regions at least one end of the first conductivity type channel regions and at end regions at least one end of the second conductivity type drain regions, thereby providing greater doping concentration of the first conductivity type at the supplementally doped end regions of the first conductivity type channel regions than in other regions of the channel regions and at the supplementally doped end regions of the drain regions than in other regions of the drain regions.

* * * * *